United States Patent
Larson et al.

(10) Patent No.: US 6,828,858 B2
(45) Date of Patent: Dec. 7, 2004

(54) CMOS CLASS AB POWER AMPLIFIER WITH CANCELLATION OF NONLINEARITY DUE TO CHANGE IN GATE CAPACITANCE OF A NMOS INPUT TRANSISTOR WITH SWITCHING

(75) Inventors: Larry Larson, La Jolla, CA (US); Chengzhou Wang, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/123,097

(22) Filed: Apr. 12, 2002

(65) Prior Publication Data

US 2003/0193371 A1 Oct. 16, 2003

(51) Int. Cl.[7] .................................................. H03F 3/16
(52) U.S. Cl. .................................... 330/277; 330/292
(58) Field of Search ........................... 330/277, 292; 327/328

(56) References Cited

U.S. PATENT DOCUMENTS

| | | | |
|---|---|---|---|
| 4,315,223 A | 2/1982 | Haque | 330/253 |
| 4,988,902 A | 1/1991 | Dingwall | 327/382 |
| 4,996,499 A * | 2/1991 | Zarabadi et al. | 330/277 |
| 5,148,065 A | 9/1992 | Krenik et al. | 327/382 |
| 5,635,873 A | 6/1997 | Thrower et al. | 330/253 |
| 6,087,900 A * | 7/2000 | Lee et al. | 330/264 |
| 6,097,253 A * | 8/2000 | Hissen | 330/277 |
| 6,255,909 B1 | 7/2001 | Muza | 330/264 |

* cited by examiner

*Primary Examiner*—Khanh V. Nguyen
(74) *Attorney, Agent, or Firm*—Greer, Burns & Crain, Ltd (57) ABSTRACT

To an existing class AB amplifier receiving at a gate of one of a NMOS or a PMOS type CMOS transistor an input signal, the gate of this CMOS transistor having a nonlinear gate capacitance with its switched operation, is added another, opposite-type, one of a NMOS or a PMOS type CMOS transistor that also receives at its gate the same input signal. The nonlinear gate capacitance of this other CMOS transistor is essentially opposite to the nonlinear gate capacitance of the existing CMOS transistor that receives the input signal within the class AB amplifier. This other transistor serves to compensate for the nonlinear gate capacitance of the existing CMOS transistor. Any nonlinearity due, in particular, to any nonlinear change in gate capacitance of a CMOS transistor that is used in particular within a class AB amplifier is thus substantially canceled.

6 Claims, 5 Drawing Sheets

NONLINEAR AMPLIFIER

CM OS CLASS AB POWER AMPLIFIER WITH CANCELLATION OF NONLINEARITY DUE TO CHANGE IN GATE CAPACITANCE OF A NMOS INPUT TRANSISTOR WITH SWITCHING

BACKGROUND OF THE INVENTION

1. Field of the Invention

The present invention generally concerns CMOS power amplifiers, particularly as are operated class AB.

The present invention particularly concerns CMOS power amplifier circuit design, particularly as operated class AB and particularly as employ an NMOS input transistor, canceling at least one circuit nonlinearity.

2. Background of the Invention

2.1 General Background of the Invention

In a wireless communications system the linearity and efficiency of the system power amplifier(s) directly limits the performance of the entire system. The efficiency of the power amplifier is critical for extending the battery lifetime, while its linearity is necessary for the transmission of a quality digital signal.

The Class AB power amplifier is widely used in wireless communications systems because it is relatively easy to design and build, and has fairly good linearity and efficiency. Most recently, circa 2001, CMOS RF power amplifiers are receiving more and more attention because these amplifiers are more cost effective than are amplifiers constructed from GaAs and silicon bipolar transistors while being suitably integrated with other CMOS IC parts, primarily digital logic. Understanding the sources of any nonlinearity in NMOS Class AB amplifier is useful for improving its performance.

The linearity of CMOS Class AB power amplifier is mostly limited by two sources. The first source is the nonlinearity of the amplifier input capacitance, which can be modeled as (1) a gate-to-drain capacitance $C_{gd}$ in electrical series with a CMOS transistor selectively conducting current $I_d$, plus (2) a gate-to-source capacitance $C_{gs}$ in electrical parallel with the same CMOS transistor. (To complete the model, a drain-to-source resistance $R_{ds}$, and a drain-to-source capacitance $C_{ds}$ are also, further, in electrical parallel with the CMOS transistor.)

When the CMOS transistor toggles on and off during Class AB operation, its gate capacitance $C_{gs}$ changes dramatically. This varying capacitance will cause a nonlinearity at the gate. In other words, the gate voltage $V_{gd}$ will be a nonlinear version of the input signal because of this capacitance.

This equivalent circuit of a CMOS transistor at the signal input of a class AB CMOS power amplifier may be simulated and analyzed, with, by way of example, SPICE, for the actual parameters of various CMOS technologies, for example the Mosis HP CMOS 0.6 pm technology. For the technology $C_{gs}$ roughly changes from 1 pF/mm to 0 pF/mm as the CMOS transistor is turned on and off.

A second source of nonlinearity is the nonlinear transconductance $G_m$ of the CMOS transistor. When the CMOS transistor is switching on and off, its drain current is also switching on and off, thus making the transconductance $G_m$ to be a nonlinear function of the transistor gate voltage $V_{gs}$. The present invention will show how to minimize this second nonlinearity.

These non-linearities are not only of considerable percentage difference, they are noticeable in the circuit response of a high-power class AB amplifier. As requirements for driving lower and lower (speaker impedance) have arisen (i.e., 32 ohms goes to 4 ohms), while power FETs grow larger and larger, the parasitic capacitance of these FETs $C_{gs}$ continues to grow.

In view of the foregoing, a need thus exists for a FET, and particularly a CMOS FET power amplifier that manages these effects better while remaining capable and efficient of high drive capability (and, likely also, low quiescent current drain).

2.2 Specific Prior Art to the Invention

U.S. Pat. No. 4,315,223 to Haque for an OPERATIONAL AMPLIFIER WITH IMPROVED FREQUENCY COMPENSATION is of relevance to the present invention for showing that the effects of circuit capacitance may be compensated. The Haque patent concerns an operational amplifier circuit (i.e., not a class AB amplifier circuit) comprised of complementary MOS transistors with a bias section, a differential amplifier section, a level shift stage and an output stage. The circuit provides for frequency compensation using two capacitors. One capacitor, connected between the differential amplifier section and the output stage through a CMOS transmission gate that functions as a resistor, acts as the dominant pole of the transfer function. A second capacitor between the amplifier section output node and a level shift transistor, functions to remove the secondary poles in the transfer function and cause the dominant pole to occur at a higher frequency.

U.S. Pat. No. 4,988,902 to Dingwall for a SEMICONDUCTOR TRANSMISSION GATE WITH CAPACITANCE COMPENSATION is if relevance to the present invention for showing that a semiconductor element—herein a transfer gate—may be used to supply a capacitance that is used in a circuit (not an amplifier circuit) for purposes of capacitance compensation. The Dingwall patent shows a transmission gate employing a pair of capacitors ahead of and a pair of capacitors behind a transistor. One capacitor of each pair is supplied with a control voltage pulse that leads and the other with a control voltage pulse that lags the complement of a control voltage pulse supplied to the gate of the transistor. The capacitors are typically each a MOS transistor with the gate serving as one terminal and the drain and source shorted together and serving as the other terminal. Moreover, each of the capacitors has a capacitance equal to one half the capacitance of the gate to source and gate to drain capacitance of the transistor. This circuitry makes possible charge compensation to avoid the build up of trapped charge in the transistor. The capacitance of the pair of capacitors ahead of the transistor is approximately equal to the gate-to-drain parasitic of the transistor and the capacitance of the pair of capacitors behind the transistor is equal to the parasitic capacitance of the gate-to-source of the transistor.

U.S. Pat. No. 5,148,065 to Krenik for CURRENT STEERING CIRCUITS AND METHODS WITH REDUCED CAPACITIVE EFFECTS concerns capacitance compensation techniques used to reduce capacitive effects that impact on the performance of certain current steering circuits. The circuits dealt with by Krenik—switching circuits—are not equivalent to the class AB amplifier circuit of the present invention. The techniques of Krenik in modifying the physical layout and structure of components, mainly transistors, used to implement a current steering circuit, are different than the compensation/cancellation technique of the present invention will be seen to be. Nonetheless, Krenik shows how capacitive effects arise in semiconductor, including CMOS, circuitry, and the limitations of semiconductor technology in compensation for these capacitive effects.

In one isolation technique of Krenik a resistor (R) or a diode (D) is coupled to a data-switched transistor to dampen voltage perturbations associated with the gate-to-source capacitance. In another technique a transistor (PDV) is included in either the output or ground legs of the current steering circuit to provide a design variable to counteract the capacitive effects of the associated data-switched (PDX/NDX) or voltage-controlled (PREF) transistor. In a bipolar substitution technique a data-switched bipolar transistor (QDX) is substituted for the data-switched MOS transistor, and made sufficiently small to significantly reduce junction capacitance. In addition, capacitive effects can be reduced by introducing fabrication alterations such as fabrication layouts in which the transistor's source contact is made within a U-shaped gate, and in which the transistor's moat perimeter is contoured for minimal gate area consistent with standard gate/contact spacing requirements.

U.S. Pat. No. 5,635,873 to Thrower, et al., for an OPERATIONAL AMPLIFIER HAVING DUMMY ISOLATION STAGE is of remote relevance to the present invention for showing that, rather than dealing with parasitic capacitance of a circuit, an attempt can be made—at least in a bipolar transistor circuit—to deal with circuit mismatch—presuming as may arise from parasitic capacitance, although any particular association of the parasitic capacitance with the gate capacitance of a CMOS transistor is likely a somewhat remote, and strained, association—to deal with the currents produced by the circuits.

The Thrower, et al., patent concerns an integrated circuit terminator for a SCSI bus with resistors made of laser-blowable fuses in an array and a reference voltage source made with a bandgap generator and a two stage amplifier including a dummy isolation stage for providing symmetrical mismatch currents. In an amplifier having (i) a differential input stage having a number of transistors arranged in a cascode configuration; (ii) an isolation stage coupled to this differential input stage, this isolation stage with first and second current sources in series and including at least one bipolar junction transistor; and (iii) a dummy stage coupled to said differential input stage symmetrically with respect to said isolation stage, the dummy stage with third and fourth current sources in series, the third current source matching said first current source and said fourth current source matching said second current source, the dummy stage is distinguished by further including at least one bipolar junction transistor. By this configuration current source mismatches within said isolation stage between the first current source and the third current source are replicated in the dummy stage and symmetrically applied to the differential input stage.

U.S. Pat. No. 6,255,909 to Muza for an ULTRA LOW VOLTAGE CMOS CLASS AB POWER AMPLIFIER WITH PARASITIC CAPACITANCE INTERNAL COMPENSATION is perhaps the patent of closest relevance to the present invention although, in dealing with the output transistors of a class AB amplifier, it presents a technique (i) non-analogous to the technique of the present invention (ii) operative at the other side of an AB amplifier from the input stage where the present invention will be seen to be operative. The Muza patent is relevant because it shows that parasitic capacitance is of relevance in the operation of both CMOS circuitry and, in particular, a class AB amplifier.

In the Muza patent an ultra low voltage CMOS, class AB power amplifier has internal compensation using only parasitic gate capacitance. The class AB power amplifier has (i) an input gain stage, (ii) a PMOS output transistor having its source connected to a first supply voltage Vdd and having its gate driven by a PMOS driver transistor in response to a positive input signal generated via the input gain stage, and, further (iii) a NMOS output transistor having its source connected to a second supply voltage Vss and having its gate driven by a NMOS driver transistor in response to a negative input signal generated via the input gain stage. The output transistors and the driver transistors are configured as a class AB output stage. Moreover, the PMOS output transistor and the NMOS output transistor are selected to have predetermined gate-source parasitic capacitance values. This selection is such that the gate-source parasitic capacitance of the PMOS output transistor and the gate-source parasitic capacitance of the NMOS output transistor combine to achieve a class AB power amplifier having a single dominant pole. This techniques is usable where the input gain stage and the output stage are devoid of Miller compensation. The class AB power amplifier so implemented substantially eliminates unwanted effects of parasitic capacitance associated with the output transistors.

SUMMARY OF THE INVENTION

The present invention contemplates a new and nonlinear cancellation technique developed specifically for NMOS power amplifiers operated in class AB. This technique applies a PMOS transistor to compensate for changes of the gate capacitance of an NMOS input transistor during the switching on and off of this transistor during Class AB operation of the circuit of which the transistor is a part, thus improving the linearity of the whole circuit.

1. An Improved Class AB CMOS Transistor Amplifier

In its principle aspect, the present invention is embodied in an improved class AB CMOS transistor amplifier.

The improved amplifier is based on a conventional, preexisting, class AB amplifier receiving an input signal at a gate of one of a NMOS or a PMOS type CMOS transistor, with this gate of the CMOS transistor having a nonlinear gate capacitance.

To this amplifier is added another, opposite-type, one of a NMOS or a PMOS type CMOS transistor. This added transistor also receives at its gate the same input signal, and has a nonlinear gate capacitance that is essentially opposite to the nonlinear gate capacitance of the existing CMOS input transistor of the class AB amplifier (the only transistor actually to amplify the input signal, and to send it on).

The nonlinear gate capacitance of this added, opposite type, CMOS transistor serves to compensate for the nonlinear gate capacitance of the normal and pre-existing CMOS transistor of the class AB amplifier, thus reducing any nonlinearity of the class AB amplifier which is due to the nonlinear gate capacitance of its CMOS transistor receiving the input signal. This added, opposite-type, CMOS transistor thus serves as nonlinear-gate-capacitance compensation transistor used with the class AB amplifier.

In one variant embodiment a class AB amplifier receives the input signal at the gate of a NMOS type CMOS transistor having an nonlinear gate-source capacitance $C_{gs1}$. To this circuit structure is added a PMOS type CMOS transistor that also receives at its gate the same input signal, thereby with its nonlinear gate source capacitance $C_{gs2}$ essentially cancel the nonlinear gate capacitance $C_{gs1}$ of the NMOS type CMOS transistor of the class AB amplifier.

It is clearly possible to have an alternative variant embodiment of the opposite sense, where a NMOS type transistor is added to compensate for variations in the gate capacitance of an input PMOS transistor to a class AB amplifier.

In the preferred embodiment the first-type CMOS transistor of the input amplifier is biased to turn on substantially exactly when the opposite second-type CMOS compensation transistor turns off, and vice versa.

2 A Method of Compensating for a Non-Linear Gate Capacitance at the Gate of NMOS- or a PMOS-Type CMOS Transistor of a Class AB Amplifier In another of its aspects, the present invention is embodied in a method of compensating a non-linear gate capacitance at the gate of NMOS- or a PMOS-type CMOS transistor of a class AB amplifier.

In the method an input signal is first-received at a gate of one of a NMOS- or a PMOS-type CMOS first transistor of a class AB amplifier. This gate has a nonlinear gate capacitance.

Meanwhile, the same input signal is second received at another NMOS- or PMOS-type CMOS second transistor of opposite type to the first transistor. This second transistor itself has a nonlinear gate capacitance that is essentially opposite to the nonlinear gate capacitance of the first transistor.

The nonlinear gate capacitance of the other, opposite type, CMOS second transistor serves to compensate for the nonlinear gate capacitance of the CMOS first transistor of the class AB amplifier. Any nonlinearity of the class AB amplifier as is due to the nonlinear gate capacitance of its CMOS first transistor that receives the input signal is thus reduced. The opposite type, CMOS second transistor thus serves as a nonlinear-gate-capacitance compensation transistor for use with a class AB amplifier.

In the method the first-receiving of the input signal may for example be at the gate of a NMOS-type CMOS input transistor of the class AB amplifier, this NMOS-type CMOS transistor having an nonlinear gate-source capacitance $C_{gs1}$, while the second-receiving of the input signal is at the gate of PMOS-type CMOS transistor having a nonlinear gate source capacitance $C_{gs2}$ that essentially cancels the nonlinear gate capacitance $C_{gs1}$.

In the method (i) the first-type CMOS first transistor of the input amplifier is preferably biased to turn on consequent to this first transistor's first-receiving of the input signal substantially exactly when (ii) the opposite second-type CMOS compensation second transistor is biased to turn off consequent to this second transistor's second-receiving of the input signal, and vice versa.

These and other aspects and attributes of the present invention will become increasingly clear upon reference to the following drawings and accompanying specification.

BRIEF DESCRIPTION OF THE DRAWINGS

Referring particularly to the drawings for the purpose of illustration only and not to limit the scope of the invention in any way, these illustrations follow:

FIG. 3, consisting of FIGS. 3a through 3c, are schematics of, respectively, (i) the preferred nonlinear capacitance compensation circuit (for NMOS CMOS transistors used in power amplifiers operated class AB) of the present invention; (ii) a first equivalent circuit of preferred circuit, and (iii) a second, simplified, equivalent circuit of the preferred circuit.

FIG. 4, consisting of FIGS. 4a and 4b, are graphs respectively showing a two-tone input signal, and the resultant (simulated) output signal, of the preferred nonlinear capacitance compensation circuit (for NMOS CMOS transistors used in power amplifiers operated class AB) of the present invention shown in FIG. 6a.

DESCRIPTION OF THE PREFERRED EMBODIMENT

The following description is of the best mode presently contemplated for the carrying out of the invention. This description is made for the purpose of illustrating the general principles of the invention, and is not to be taken in a limiting sense. The scope of the invention is best determined by reference to the appended claims.

Although specific embodiments of the invention will now be described with reference to the drawings, it should be understood that such embodiments are by way of example only and are merely illustrative of but a small number of the many possible specific embodiments to which the principles of the invention may be applied. Various changes and modifications obvious to one skilled in the art to which the invention pertains are deemed to be within the spirit, scope and contemplation of the invention as further defined in the appended claims.

Figure 1:
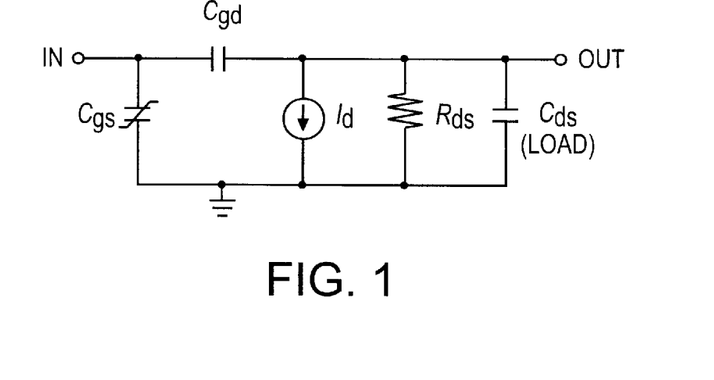
FIG. 1 is a prior art schematic of an equivalent circuit of a NMOS CMOS transistor modeling the nonlinear gate capacitance of the transistor.

Of the two major sources—discussed in the Background of the Invention section of this specification—of nonlinearity in the class AB operation of a CMOS power amplifier, nonlinear input capacitance is illustrated in the NMOS CMOS input power transistor equivalent circuit of FIG. 1. When the transistor turns on and off during Class AB operation, the gate capacitance $C_{gs}$ also changes dramatically. This varying capacitance causes nonlinearity at the gate of the transistor. In other words the gate voltage signal Out will be a nonlinear version of the input signal In because of this capacitance.

Figure 2:
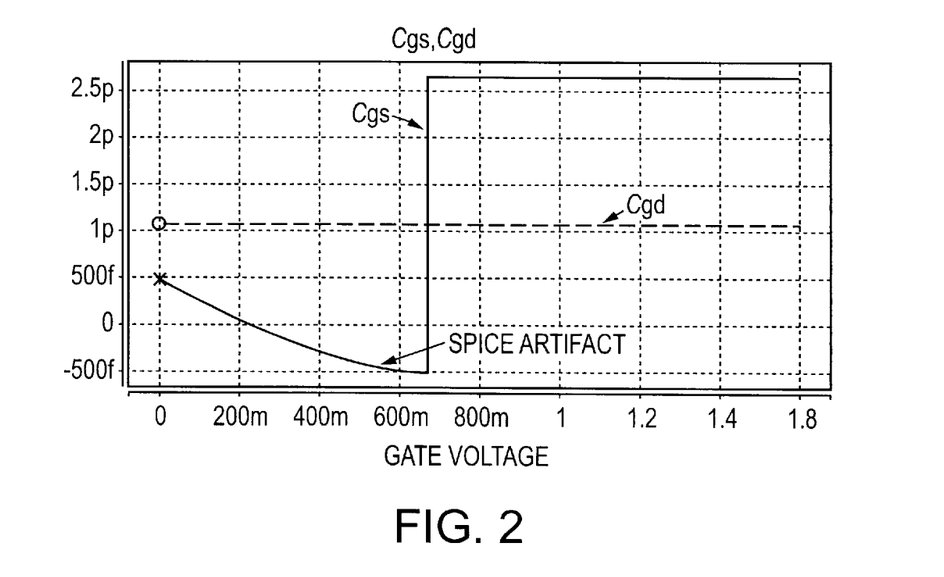
FIG. 2 is a prior art graph of simulation with the SPICE program of the equivalent circuit of FIG. 1 with W=2.6 mm and L9=0.6 μm.

Also as previously explained, the equivalent circuit of a NMOS CMOS transistor (as used at the signal input of a class AB CMOS power amplifier) shown in FIG. 1 may be simulated and analyzed. Such a simulation using the SPICE program for the exemplary parameters of the Mosis HP CMOS 0.6 pm technology is graphed in FIG. 2. For this technology $C_{gs}$ roughly changes from 1 pF/mm to 0 pF/mm as the CMOS transistor is turned on and off. The present invention will show how to compensate for this nonlinearity in the NMOS CMOS transistor (as used at the signal input of a class AB CMOS power amplifier).

The input capacitance of NMOS Class AB amplifier is roughly $C_{gs}+(1+A) C_{gd}$. In the present design, when the transistor switches from on to off, $C_{gs}$ roughly changes from 1 pF/mm to 0 pF/mm, and $C_{gd}$ is almost constant. Therefore, it is only necessary to compensate this for this nonlinear $C_{gs}$.

Figure 3A:
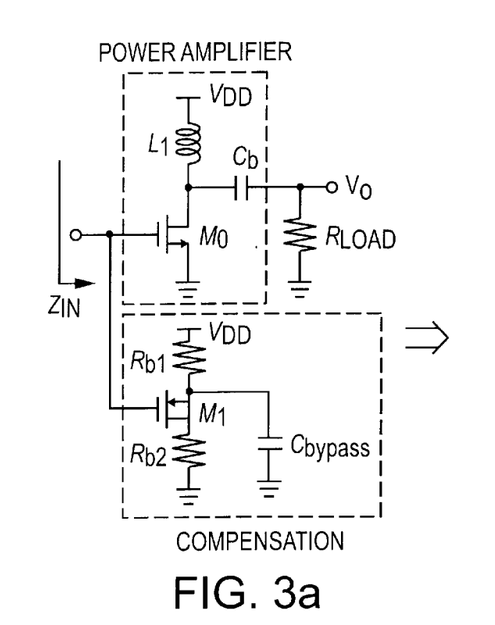
Figure 3B:
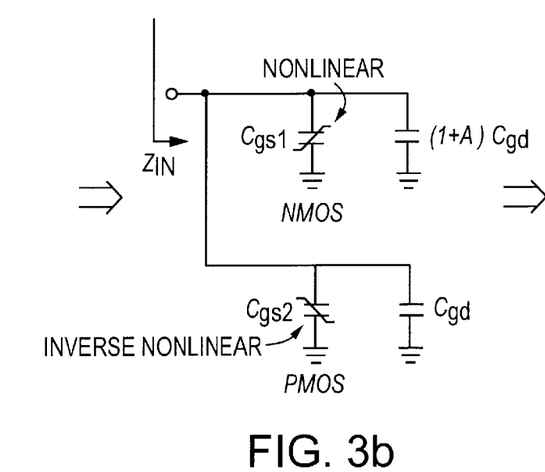
Figure 3C:
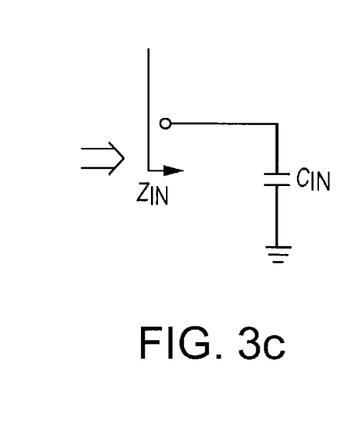

In accordance with the present invention, in order to make the input capacitance of the NMOS CMOS transistor at the input of a Class AB CMOS amplifier constant, a PMOS transistor is connected to the gate of the NMOS transistor as illustrated in FIG. 3a. The gate of the NMOS transistor serves to bias the drain of the PMOS transistor so that when the NMOS transistor is off, it turns the PMOS transistor on, causing this PMOS transistor to contribute such capacitance to the circuit as serves to make the input capacitance substantially constant. This is shown in FIGS. 3b and 3c where are shown the equivalent, and simplified equivalent, circuits of the preferred embodiment of the present invention shown in FIG. 3a.

The input capacitance will become constant after the compensation, but will be larger than the original input capacitance and will reduce the power gain.

Figure 4A:
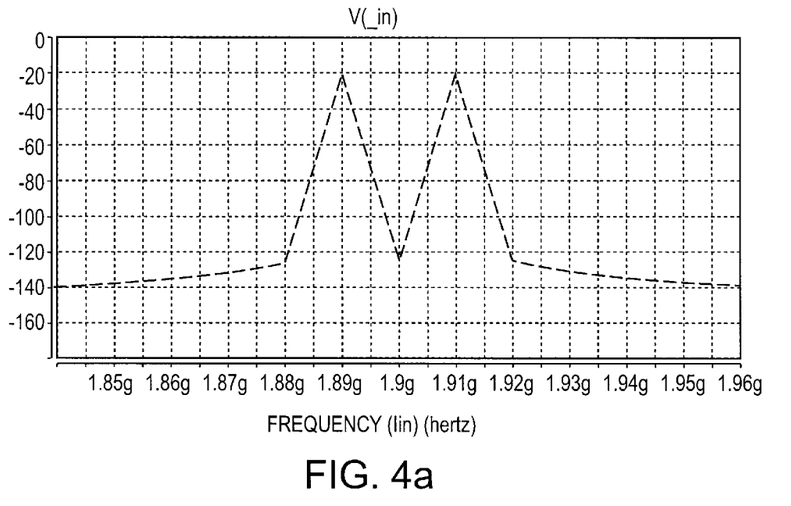
Figure 4B:
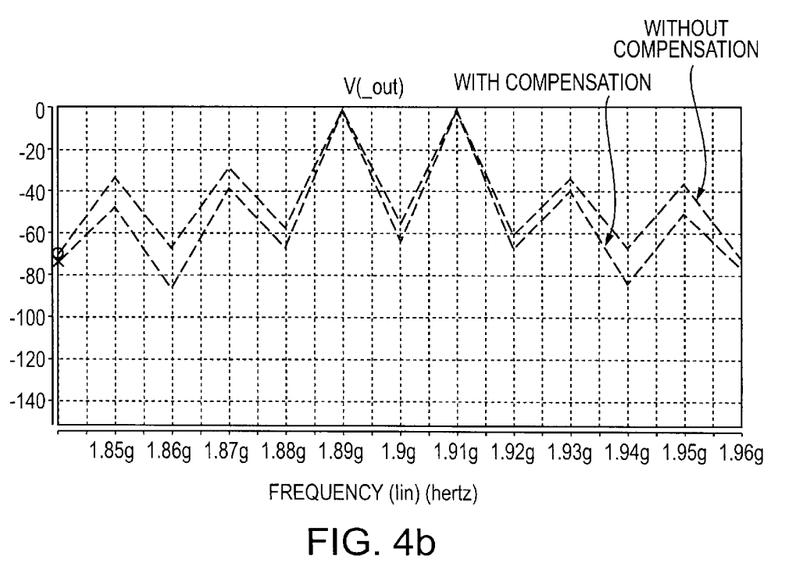
Figure 5:
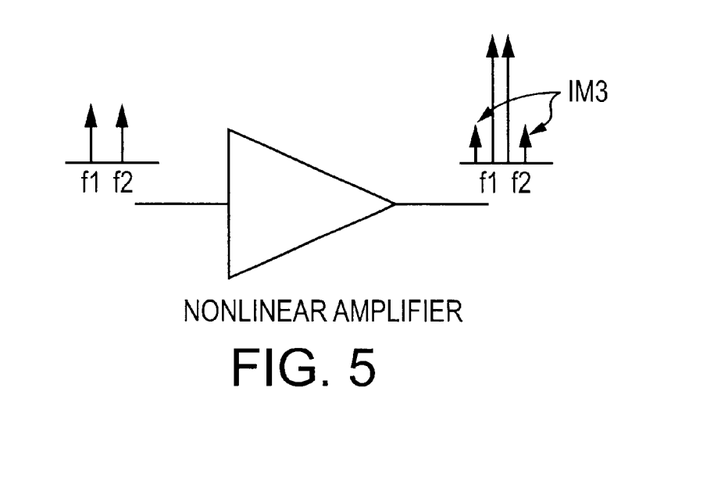
FIG. 5 shows a schematic symbol, accompanied by diagrammatically represented signal input and output, of the preferred nonlinear capacitance compensation circuit (for NMOS CMOS transistors used in power amplifiers operated class AB) of the present invention.

In order to validate the above analysis, the preferred embodiment of the compensation circuit in a accordance with the present invention shown in FIG. 3a was simulated in HSPICE and laid out using the HP 0.6 pm CMOS technology provided by Mosis. The two-tone simulation results shown in FIGS. 4a and 4b—respectively showing the input and output signals—reveal that the circuit of the present invention with compensation accords much better linearity than does the same Class AB NMOS amplifier in its original, prior art, configuration. In the case of the particular technology simulated in FIGS. 4a and 4b, about an 8 dB (simulated) improvement in the intermodulation is realized.

Figure 6:
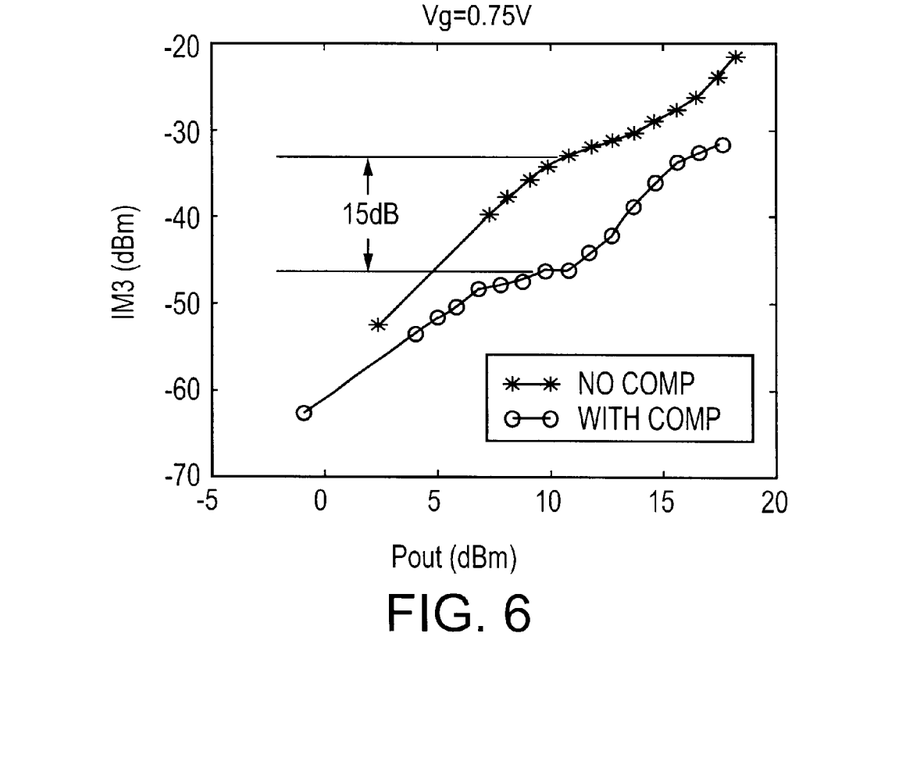
FIG. 6 is a graph of the performance in respect of a two-tone input signal of (i) an original, uncompensated, amplifier, and of (ii) an amplifier employing the preferred nonlinear capacitance compensation circuit (for NMOS CMOS transistors used in power amplifiers operated class AB) of the present invention.

More particularly, it will be understood by practitioners of the electrical design arts that the two-tone test is used to estimate the linearity of amplifiers. In the case of the preferred, nonlinearity compensated, amplifier of the present invention, actual measurement data graphed in FIG. 6 shows that the amplifier of the present invention with nonlinear input capacitance compensation has at least 6 dB of IM3 improvement compared to the same amplifier in its original, prior art, configuration without compensation. Note that the $P_{out}$ of the plot is the corresponding one-tone output power.

Figure 7:
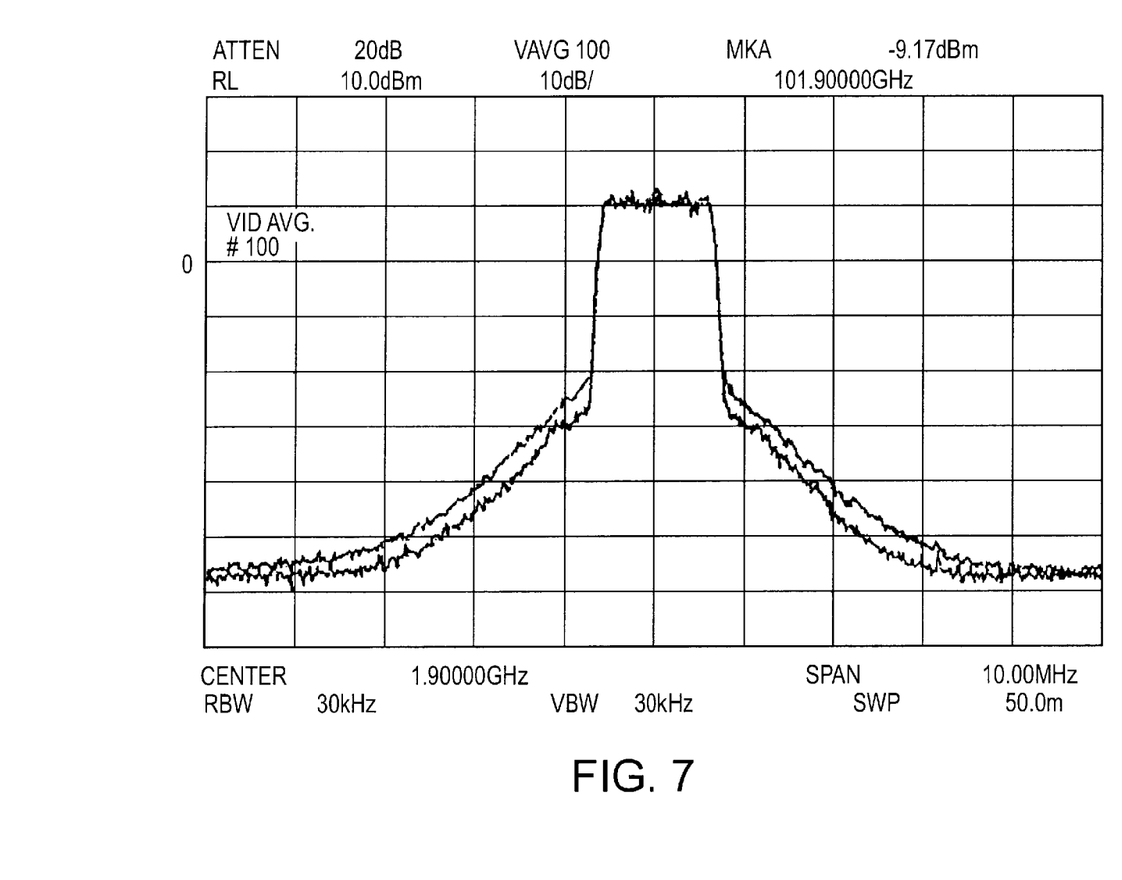
FIG. 7 is a graph of the results measurable in an amplifier circuit in a accordance with the present invention in response to a CDMA signal.

As shown in the graph of FIG. 7, the preferred transistor compensation and amplifier circuit of the present invention was also tested with a CDMA signal. The graphed data shows that the amplifier with nonlinear capacitor cancellation has about 6 dB lower sideband regrowth than the same amplifier in its original, prior art, configuration operating at the same output power level.

Accordingly, both (1) simulation with SPICE as shown in FIG. 4, and (2) actual two-tone measurement results as shown in FIG. 6, and (3) actual CDMA measurement results as shown in FIG. 7, show the improvements in circuit linearity realized by the present invention, and serve to validate the invention.

In accordance with the preceding explanation, variations and adaptations of the improved CMOS amplifier circuit in accordance with the present invention will suggest themselves to a practitioner of the electrical circuit design arts. For example, the cancellation of nonlinear gate capacitance is equally relevant to CMOS transistors of the NMOS and PMOS types.

In accordance with these and other possible variations and adaptations of the present invention, the scope of the invention should be determined in accordance with the following claims, only, and not solely in accordance with that embodiment within which the invention has been taught.

What is claimed is:

1. An improved class AB amplifier comprising:
    a resistive load further electrically connected beyond the amplifier;
    a capacitive load within the amplifier, and not electrically connected beyond the amplifier;
    one of a NMOS or a PMOS type first CMOS transistor receiving at its gate an input signal, the gate of this first CMOS transistor having a first nonlinear gate capacitance $C_{gs1}$, this first CMOS transistor producing an amplified input signal into the resistive load and beyond; and
    one of a NMOS or a PMOS type second CMOS transistor, opposite in type to the first CMOS transistor, also receiving at its gate the same input signal, a second nonlinear gate capacitance $C_{gs2}$ of this second CMOS transistor being essentially opposite to the first nonlinear gate capacitance $C_{gs1}$ of the first CMOS transistor, this second CMOS transistor producing an amplified input signal into the capacitive load;
    wherein the second nonlinear gate capacitance $C_{gs2}$ of the second, opposite type, CMOS transistor serves to compensate for the first nonlinear gate capacitance $C_{gs1}$ of the first CMOS transistor of the class AB amplifier, thus reducing any nonlinearity of the class AB amplifier as is due to the first nonlinear gate capacitance $C_{gs1}$ of its first CMOS transistor that receives and amplifies the input signal;
    wherein a bias point of the second CMOS transistor and the capacitive load are optimized for the compensation, and not for signal amplification cooperatively with the first CMOS transistor;
    wherein the second, opposite type, CMOS transistor is a nonlinear-gate-capacitance compensation transistor used with the class AB amplifier, only, and is not a producer of any amplified signal further electrically connected beyond the amplifier.

2. The improved class AB amplifier according to claim wherein the first CMOS transistor of the class AB amplifier receives the input signal at the gate of a NMOS type CMOS transistor having the first nonlinear gate-source capacitance $C_{gs1}$; and
    wherein the second CMOS transistor of the class AB amplifier is a PMOS type CMOS transistor also receiving at its gate the same input signal so as to with its second nonlinear gate source capacitance $C_{gs2}$ essentially cancel the first nonlinear gate source capacitance $C_{gs1}$ of the NMOS type first CMOS transistor of the class AB amplifier.

3. The improved class AB amplifier according to claim 1 wherein the first-type first CMOS transistor of the input amplifier is biased to turn on substantially when the opposite second-type second CMOS compensation transistor turns off, and vice versa.

4. A method of compensating a non-linear gate capacitance at the gate of NMOS- or a PMOS-type CMOS first transistor of a class AB amplifier, the method comprising:
    first-receiving at a gate of one of a NMOS- or a PMOS-type CMOS first transistor of a class AB amplifier, this gate having a first nonlinear gate capacitance $C_{gs1}$, an input signal; while also
    second-receiving the same input signal at another, NMOS- or PMOS-type, CMOS second transistor of opposite type to the first transistor, this second transistor itself having a second nonlinear gate capacitance $C_{gs2}$ that is essentially opposite to the first nonlinear gate capacitance $C_{gs1}$ of the first transistor;
    amplifying at the CMOS first transistor the received input signal for supply into a load outside the amplifier; while
    amplifying at the CMOS second transistor the received input signal for supply only into a capacitor within the amplifier;

wherein the second nonlinear gate capacitance $C_{gs2}$ of the second, opposite type, CMOS second transistor, and the bias of this second transistor, and the capacitor, serve to compensate for the first nonlinear gate capacitance $C_{gs1}$ of the CMOS first transistor of the class AB amplifier, thus reducing any nonlinearity of the class AB amplifier as is due to the first nonlinear gate capacitance $C_{gs1}$ of its CMOS first transistor that receives the input signal;

wherein the second, opposite type, CMOS transistor thus serves as a nonlinear-gate-capacitance compensation transistor for use with a class AB amplifier, only, and does not supply and amplified signal outside the amplifier.

5. The method of compensating the non-linear gate capacitance at the gate of NMOS- or a PMOS-type CMOS first transistor of a class AB amplifier according to claim 4 wherein first-receiving of the input signal is at the gate of a NMOS-type CMOS first transistor of the class AB amplifier, this NMOS-type CMOS transistor having the first nonlinear gate-source capacitance $C_{gs1}$; and wherein the second-receiving of the input signal is at the gate of PMOS-type CMOS second transistor having the second nonlinear gate source capacitance $C_{gs2}$ that essentially cancels the first nonlinear gate capacitance $C_{gs1}$ of the NMOS-type CMOS first transistor of the class AB amplifier.

6. The method of compensating the non-linear gate capacitance at the gate of NMOS- or a PMOS-type CMOS first transistor of a class AB amplifier according to claim 4 wherein the first-type CMOS first transistor of the input amplifier is biased to turn on consequent to this first transistor's first-receiving of the input signal substantially when the opposite second-type CMOS compensation second transistor is biased to turn off consequent to this second transistor's second-receiving of the input signal, and vice versa.

* * * * *